(12) United States Patent
Liu et al.

(10) Patent No.: US 9,231,327 B1
(45) Date of Patent: Jan. 5, 2016

(54) ELECTRONIC CIRCUIT SLIDABLE INTERCONNECT

(71) Applicant: Flextronics AP, LLC, Broomfield, CO (US)

(72) Inventors: Weifeng Liu, Dublin, CA (US); Anwar Mohammed, San Jose, CA (US); Murad Kurwa, San Jose, CA (US)

(73) Assignee: Flextronics AP, LLC, Broomfield, CO (US)

( * ) Notice: Subject to any disclaimer, the term of this patent is extended or adjusted under 35 U.S.C. 154(b) by 24 days.

(21) Appl. No.: 14/145,801

(22) Filed: Dec. 31, 2013

Related U.S. Application Data

(60) Provisional application No. 61/870,627, filed on Aug. 27, 2013, provisional application No. 61/870,646, filed on Aug. 27, 2013.

(51) Int. Cl.
*H01R 13/28* (2006.01)
*H01R 25/00* (2006.01)
*H01R 13/22* (2006.01)

(52) U.S. Cl.
CPC .................................... *H01R 13/22* (2013.01)

(58) Field of Classification Search
CPC . H01H 2001/125; H01H 1/12; H01R 12/777; H01R 12/78; H01R 13/28; H01R 4/00; H01R 13/24; H01R 13/641; H01R 13/625; H01R 13/465; H01R 23/27; H01R 23/28; H01R 25/00; A44B 19/24

USPC .............. 439/65, 285, 488–492, 290, 291; 206/527; 24/381, 403, 413, 414, 415, 24/430

See application file for complete search history.

(56) References Cited

U.S. PATENT DOCUMENTS

| | | | |
|---|---|---|---|
| 3,622,936 A * | 11/1971 | Negishi | H05K 3/365 24/411 |
| 4,931,021 A * | 6/1990 | Mohan | 439/285 |
| 6,591,463 B2 * | 7/2003 | Wang | 24/396 |
| 6,747,227 B2 * | 6/2004 | Marmaropoulos et al. | 200/550 |
| 6,805,568 B2 * | 10/2004 | Kuzmenka | 439/285 |
| 2005/0235468 A1 * | 10/2005 | Borchardt et al. | B65D 33/2541 24/399 |
| 2010/0136804 A1 * | 6/2010 | Strickland | 439/65 |
| 2013/0247288 A1 * | 9/2013 | Kotos | 2/463 |

* cited by examiner

*Primary Examiner* — James Harvey
*Assistant Examiner* — Milagros Jeancharles
(74) *Attorney, Agent, or Firm* — Haverstock & Owens LLP

(57) ABSTRACT

An electronic circuit interconnect apparatus that includes two zipper tracks configured to zip together thereby causing a first circuit to electrically couple with a second circuit. Specifically, each of the zipper tracks include a plurality of teeth, one or more of which are electrically coupled to the first circuit or the second circuit. As a result, when the teeth coupled to the first circuit are zipped to the teeth coupled to the second circuit it causes the first and second circuits to be electrically coupled.

24 Claims, 2 Drawing Sheets

ELECTRONIC CIRCUIT SLIDABLE INTERCONNECT

FIELD OF THE INVENTION

This invention relates generally to electrical interconnects. More particularly, this invention relates to a zipper electrical interconnect for electrically interconnecting a plurality of circuits.

BACKGROUND OF THE INVENTION

Traditionally, electronic circuitry is coupled together via permanent physical connections such as wires. Similarly, non-permanent connections, such as switches or plugs and sockets, although able to selectively disconnect two or more portions of a circuit, are not designed to enable physical separation of the two portions of the circuit because it would break the switch apart. With regard to wearable electronics, this inability to physically separate the circuitry created a problem of preventing washing, upgrading, or partial replacement of the circuits because even if only one portion of the circuitry is non-washable, non-upgradable and/or has failed it prevents the whole circuit from that functionality. Accordingly, this lack of selective physical and electrical coupling/de-coupling results in such product having higher cost due to the increased waste due to failures and non-upgradability despite the product also having less functionality.

SUMMARY OF THE INVENTION

An electronic circuit interconnect apparatus that includes two zipper tracks configured to zip together thereby causing a first circuit to electrically couple with a second circuit. Specifically, each of the zipper tracks include a plurality of teeth, one or more of which are electrically coupled to the first circuit or the second circuit. As a result, when the teeth coupled to the first circuit are zipped to the teeth coupled to the second circuit it causes the first and second circuits to be electrically coupled. This provides the advantage of implementing circuitry within clothing or other materials that is able to be selectively operated based on the selective zipping of the interconnect. Further, the selective coupling provided by the interconnect enables circuitry to be selectively removed (e.g. unzipped) from an article of clothing such that the clothing is able to be washed and/or the circuitry is able to be replaced or upgraded.

A first aspect of the application is directed to An electronic circuit interconnect apparatus. The apparatus comprises a first zipper track having a plurality of first teeth coupled to a first tape and one or more first traces electrically coupled to one or more of the first teeth that are conductive, a second zipper track having a plurality of second teeth coupled to a second tape and one or more second traces electrically coupled to one or more of the second teeth that are conductive, a first circuit electrically coupled to one or more of the first traces and a second circuit electrically coupled to one or more of the second traces, wherein the second and first zipper tracks are configured to physically zip together such that the one or more of the first teeth electrically couple with the one or more of the second teeth thereby electrically coupling the first circuit to the second circuit. In some embodiments, at least one of the one or more of the first teeth is adjacent to a non-conductive first tooth of the first teeth and at least one of the one or more of the second teeth are adjacent to a non-conductive second tooth of the second teeth. In some embodiments, the non-conductive first tooth and the non-conductive second tooth each comprise a conductive material plated with a non-conductive material. In some embodiments, the one or more of the first teeth and the one or more of the second teeth are positioned on the first tape and the second tape such that when the second and first zipper tracks are zipped together each of the one or more first teeth electrically couples to at least one of the one or more of the second teeth. In some embodiments, the one or more of the first teeth are separated into one or more groups, wherein the teeth in each group are positioned serially along the first tape such that when the second and first zipper tracks are zipped together all the teeth within one of the groups are electrically coupled together creating a redundant electrical connection. In some embodiments, the one or more of the first teeth and the one or more of the second teeth comprise conductive material selected from the group consisting of copper, nickel, gold, palladium, silver, a conductive polymer or a combination thereof. In some embodiments, the one or more of the first teeth and the one or more of the second teeth comprise a non-conductive material plated with a conductive material selected from the group consisting of copper, aluminum, nickel, gold, palladium, silver, a conductive polymer or a combination thereof. In some embodiments, the one or more of the first teeth and the one or more of the second teeth each have a visual indicator that distinguishes the one or more of the first teeth and the one or more of the second teeth from the remainder of the plurality of first teeth and the plurality of second teeth such that the one or more of the first teeth and the one or more of the second teeth are able to be visually identified and aligned. In some embodiments, the first circuit comprises a first component having a plurality of states, wherein the first component is configured to switch between the plurality of states based on which of the one or more of the first teeth are electrically coupled with the one or more of the second teeth due to the extent that the second and first zipper tracks are physically zipped together. In some embodiments, the second circuit comprises a battery and the plurality of states comprise a powered state and an unpowered state, wherein if all of the one or more of the first teeth are electrically coupled with the one or more of the second teeth the first component receives power from the battery and switches to the powered state and otherwise is in the unpowered state. In some embodiments, the apparatus further comprises a third zipper track having a plurality of third teeth coupled to a third tape and one or more third traces electrically coupled to one or more of the third teeth that are conductive, wherein the second circuit is electrically coupled to one or more of the third traces, a fourth zipper track having a plurality of fourth teeth coupled to a fourth tape and one or more fourth traces electrically coupled to one or more of the fourth teeth that are conductive and a third circuit electrically coupled to one or more of the fourth traces, wherein the third and fourth zipper tracks are configured to physically zip together such that the one or more of the third teeth electrically couple with the one or more of the fourth teeth thereby electrically coupling the second circuit to the third circuit. In some embodiments, the first circuit is integrated into an article of clothing and the second circuit is integrated into the article of clothing such that the first circuit and the second circuit are physically coupled together via the article of clothing. In some embodiments, the first circuit is integrated into a first article of clothing and the second circuit is integrated into a second article of clothing such that the first circuit and the second circuit are only selectively physically coupled together when the first and second zipper tracks are zipped together.

A second aspect of the application is directed to a method of providing an electronic circuit interconnect apparatus. The method comprises forming a first zipper track by coupling a plurality of first teeth to a first tape and electrically coupling one or more first traces to one or more of the first teeth that are conductive, forming a second zipper track by coupling a plurality of second teeth to a second tape and electrically coupling one or more second traces to one or more of the second teeth that are conductive, electrically coupling a first circuit to one or more of the first traces and electrically coupling a second circuit to one or more of the second traces; wherein the second and first zipper tracks are configured to physically zip together such that the one or more of the first teeth electrically couple with the one or more of the second teeth thereby electrically coupling the first circuit to the second circuit. In some embodiments, at least one of the one or more of the first teeth is adjacent to a non-conductive first tooth of the first teeth and at least one of the one or more of the second teeth are adjacent to a non-conductive second tooth of the second teeth. In some embodiments, the non-conductive first tooth and the non-conductive second tooth each comprise a conductive material plated with a non-conductive material. In some embodiments, the one or more of the first teeth and the one or more of the second teeth are positioned on the first tape and the second tape such that when the second and first zipper tracks are zipped together each of the one or more first teeth electrically couples to at least one of the one or more of the second teeth. In some embodiments, the one or more of the first teeth are separated into one or more groups, wherein the teeth in each group are positioned serially along the first tape such that when the second and first zipper tracks are zipped together all the teeth within one of the groups are electrically coupled together creating a redundant electrical connection. In some embodiments, the one or more of the first teeth and the one or more of the second teeth comprise conductive material selected from the group consisting of copper, nickel, gold, palladium, silver, a conductive polymer or a combination thereof. In some embodiments, the one or more of the first teeth and the one or more of the second teeth comprise a non-conductive material plated with a conductive material selected from the group consisting of copper, aluminum, nickel, gold, palladium, silver, a conductive polymer or a combination thereof. In some embodiments, the one or more of the first teeth and the one or more of the second teeth each have a visual indicator that distinguishes the one or more of the first teeth and the one or more of the second teeth from the remainder of the plurality of first teeth and the plurality of second teeth such that the one or more of the first teeth and the one or more of the second teeth are able to be visually identified and aligned. In some embodiments, the first circuit comprises a first component having a plurality of states, wherein the first component is configured to switch between the plurality of states based on which of the one or more of the first teeth are electrically coupled with the one or more of the second teeth due to the extent that the second and first zipper tracks are physically zipped together. In some embodiments, the second circuit comprises a battery and the plurality of states comprise a powered state and an unpowered state, wherein if all of the one or more of the first teeth are electrically coupled with the one or more of the second teeth the first component receives power from the battery and switches to the powered state and otherwise is in the unpowered state. In some embodiments, the method further comprises forming a third zipper track by coupling a plurality of third teeth to a third tape and electrically coupling one or more third traces to one or more of the third teeth that are conductive, electrically coupling the second circuit to one or more of the third traces, forming a fourth zipper track by coupling a plurality of fourth teeth to a fourth tape and electrically coupling one or more fourth traces to one or more of the fourth teeth that are conductive and electrically coupling a third circuit to one or more of the fourth traces, wherein the third and fourth zipper tracks are configured to physically zip together such that the one or more of the third teeth electrically couple with the one or more of the fourth teeth thereby electrically coupling the second circuit to the third circuit. In some embodiments, the first circuit is integrated into an article of clothing and the second circuit is integrated into the article of clothing such that the first circuit and the second circuit are physically coupled together via the article of clothing. In some embodiments, the first circuit is integrated into a first article of clothing and the second circuit is integrated into a second article of clothing such that the first circuit and the second circuit are only selectively physically coupled together when the first and second zipper tracks are zipped together.

DETAILED DESCRIPTION OF THE INVENTION

In the following description, numerous details are set forth for purpose of explanation. However, one of ordinary skill in the art will realize that the invention may be practiced without the use of these specific details or with equivalent alternatives. Thus, the presently claimed invention is not intended to be limited to the embodiments shown but is to be accorded the widest scope consistent with the principles and features described herein. Throughout the description similar components are similarly marked in order to aid comprehension.

Embodiments of the invention are directed to an electronic circuit interconnect apparatus that includes two zipper tracks configured to zip together thereby causing a first circuit to electrically couple with a second circuit. Each of the zipper tracks include a plurality of teeth, one or more of which are electrically coupled to the first circuit or the second circuit. As a result, when the teeth coupled to the first circuit are zipped to the teeth coupled to the second circuit it forms an electrical connection that causes the first and second circuits to be electrically coupled. In this manner, any number of circuits are able to be selectively electrically coupled together by zipping or unzipping the zipper tracks coupled to the circuits together. Further, the zipping is able to be full or partial wherein different levels of zipping cause different combinations of electrical connections between the circuits. Consequently, the operation of the circuits is able to be controlled by adjusting the amount each zipper is zipped.

Figure 1:
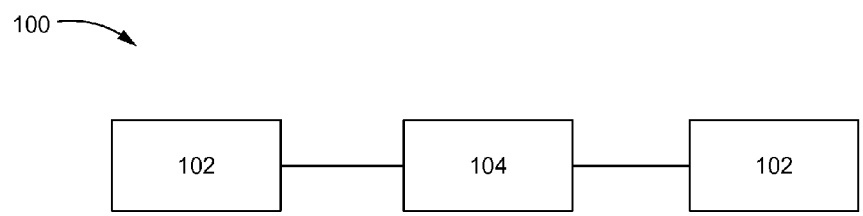
FIG. 1 illustrates an electronic circuit interconnect system according to some embodiments.

FIG. 1 illustrates an electronic circuit interconnect system 100 according to some embodiments. As shown in FIG. 1, the system 100 comprises one or more electronic circuits 102 selectively or detachably electrically coupled together by one or more circuit interconnects 104. For example, a single circuit interconnect 104 is able to couple two circuits 102 together such that the two circuits 102 effectively become a single integrated circuit. Alternatively, any combination of circuits 102 and interconnects 104 are able to be used. For example, multiple independent interconnects 104 are able to be used to selectively electrically couple a single pair of circuits 102 together and/or a single interconnect 104 is able to selectively electrically couple three or more circuits 102 together. Additionally, a chain or series of selectively electrically coupled circuits 102 is able to be formed by coupling two or more circuits 102 together in series with at least one interconnect 104 between each subsequent circuit 102.

In some embodiments, the circuits 102 are able to comprise one or more electrical components such as resistors, capacitors, inductors, transformers, diodes, op-amps, batteries, antennas, processors, microchips and/or other types of electronic components as are well known in the art. In some embodiments, one or more of the circuits 102 are able to be integrated into cloth, fabric or other flexible material such as articles of clothing. For example, a pair of circuits 102 are able to be on either side of a jacket. In such embodiments, the circuits 102 are able to be wholly or partially flexible such that they are able to flex with the flexible material. Alternatively, one or more of the circuits 102 are able to be integrated into rigid materials such as printed circuit boards. In some embodiments, the circuits 102 are able to be wholly covered/enveloped within the flexible and/or rigid material. Alternatively, all or part of the circuits 102 are able to be exposed to or accessible from the surface of the flexible and/or rigid material.

For example, one of the circuits 102 is able to be a heart monitor that is integrated into the material of a tee-shirt, wherein the second circuit 102 is a battery for powering the monitor 102 that is able to be recharged and/or replaced by another battery circuit 102 when needed. As another example, a first circuit 102 is able to have a processor and the second circuit 102 is able to comprise a memory that provides programming for the processor to execute. In such an example, the memory/programming is able to be upgraded and/or replaced by selectively removing the second circuit 102 in order to upgrade the stored programming or replacing the second circuit 102 with another circuit 102 having a memory storing a different program. As a result, the system 100 provides the advantage of enabling users to control how, when and what circuits 102 to couple together.

Figure 2:
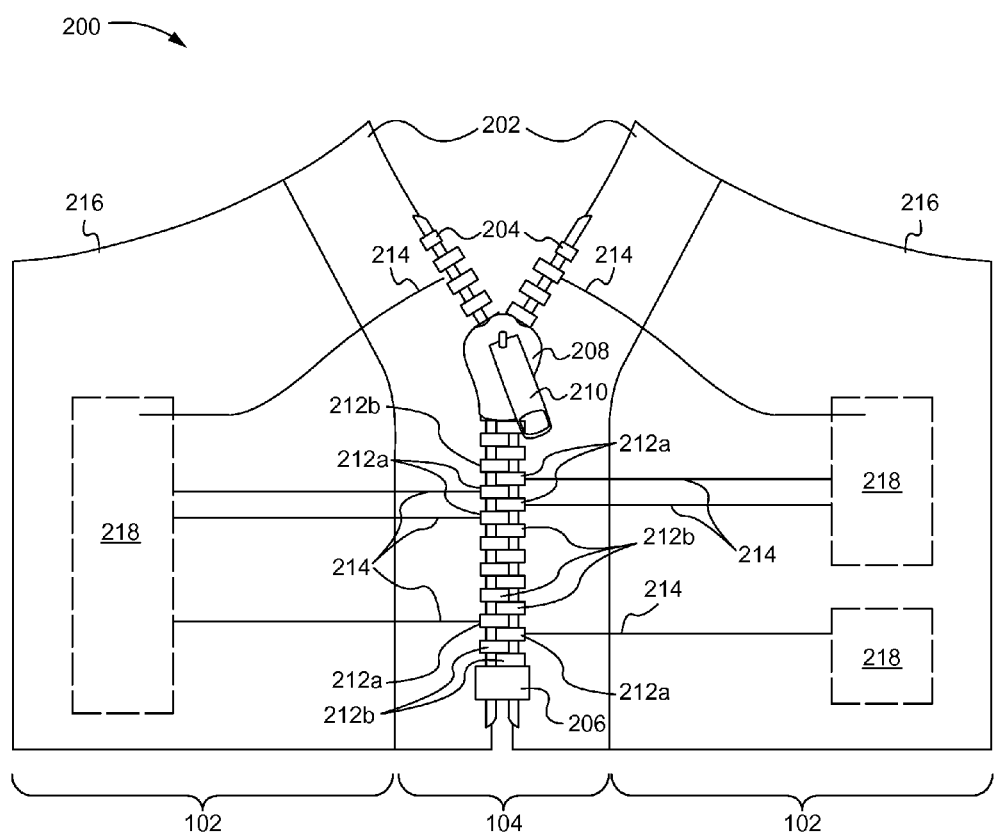
FIG. 2 illustrates an electronic circuit interconnect apparatus according to some embodiments.

FIG. 2 illustrates an electronic circuit interconnect system 100 assembled into an apparatus 200 according to some embodiments. The apparatus 200 is able to comprise two circuits 102 selectively electrically coupled together by an interconnect 104. Alternatively, as described above, one or more circuits 102 and/or interconnects 104 are able to be added or omitted from the apparatus 200. As shown in FIG. 2, the circuits 102 comprise a substrate 216 and one or more electronic components 218 coupled to the substrate 216. In some embodiments, some or all of the components 218 are embedded or integrated within the substrate 216. Alternatively, one or more of the components 218 are able to be wholly or partially positioned on or accessible from a surface of the substrate 216. Although in FIG. 2 two separate substrate 216 are shown on either side of the interconnect 104, it is contemplated that a single substrate 216 that couples to both sides of the interconnect 104 is able to be used. Alternatively or in addition, two or more substrates 216 are able to couple to a single side of one or more of the interconnects 104 or any combination of single and/or multiple coupling thereof.

In some embodiments, the substrates 216 are a flexible cloth, fabric or textile such as cotton, nylon, polyester, wool, other types of cloths/fabrics/textiles well known in the art, or a combination thereof. For example, in some embodiments one or more of the substrates 216 are able to be a part of or form the entirety of an article of clothing such as a shirt, a jacket or other type of clothing. As another example, one or more of the substrates 216 are able to be article of fabric that is not intended for wear such as bed sheets, curtains, tablecloths or other such fabrics. Alternatively, some or all of the substrates 216 are able to be a material that is wholly or partially rigid such as a printed circuit board or other types of rigid materials. As described above, the components 218 are able to comprise one or more resistors, capacitors, inductors, transformers, diodes, op-amps, batteries, antennas, processors, microchips and/or other types of electronic components as are well known in the art. Additionally, although in FIG. 2 only one or two components 218 are shown in each substrate 216, any number of electrically coupled or uncoupled components 218 per substrate 216 are contemplated.

The circuit interconnect 104 comprises a pair zipper tracks, a slider 208 slidably coupled to each of the zipper tracks and a pull tab 210 coupled to the slider 208. Each of the zipper tracks are able to comprise a tape 202 with a top stop 204, a bottom stop 206 and a plurality of teeth 212 between the top stop 204 and the bottom stop 206 along the edge of the tape 202. The teeth 212 are able to be uniformly spaced along each tape 202, but offset from one tape 202 to another such that the teeth 212 from one tape 202 are able to physically couple, interlock and/or zip to the other tape 202 by sliding the slider 208 along the zipper tracks forcing them together. Similarly, the teeth 212 from one tape 202 are able to physically de-couple and/or unzip from the other tape 202 by sliding the slider 208 along the zipper tracks in the opposite direction. The top stop 204 and the bottom stop 206 obstruct the slider 208 from sliding off of one or both of the zipper tracks at the top and bottom of the tracks. Alternatively, in some embodiments the bottom stop 206 and/or top stop 204 are able to be replaced with an insertion pin/bolt and retainer box as are well known in the art in order to provide an open-ended interconnect. In such embodiments it is understood that the slider 208 is able to disconnect/de-couple from one or both of the zipper tracks using the insertion pin/retainer box function.

Each zipper track also comprises one or more electrically conductive teeth 212a and non-conductive teeth 212b. The conductive teeth 212a are able to comprise copper, aluminum, gold, nickel, silver, palladium, other conductive metals, conductive polymers or a combination thereof. The non-conductive teeth 212b are able to comprise acrylonitrile butadiene styrene, polyacetal resin, polyethylene, other non-conductive polymers/materials or a combination thereof. In some embodiments, the entire body of the conductive teeth 212a is conductive and/or the entire body of the non-conductive teeth 212b is non-conductive. Alternatively, some or all of the body of the conductive teeth 212a is able to be non-conductive and/or some or all of the body of the non-conductive teeth 212b is able to be conductive. For example, one or more of the conductive teeth 212a and/or non-conductive teeth 212b are able to have a non-conductive base that is wholly or partially plated with one of the conductive materials described above. Similarly, one or more of the conductive teeth 212a and/or non-conductive teeth 212b are able to have a conductive base that is wholly or partially covered with a non-conductive film of one or more of the non-conductive materials described above. In this way, the portions of the teeth 212 that contact the other teeth 212 when the interconnect 104 is zipped are able to be selectively configured to form a conductive contact or a non-conductive contact as desired. Additionally, the base (whether conductive or non-conductive) is able to be plated with one or more additional plating layers to provide a better electrical connection and/or protective finish. For example, a base tooth (made of, for example, one or more of copper, steel, brass, bronze, aluminum, conductive polymer or other non-noble metal) is able to be plated with one or more layers of protected finishes such as gold (e.g. gold over nickel), silver, solder (tin, tin lead, lead free solder and other types of solder), and other protective finishes known in the art.

Each conductive tooth 212a on a first zipper track has a corresponding conductive tooth 212a on a corresponding second zipper track. Similarly, each non-conductive tooth 212b on the first zipper track has a corresponding non-conductive tooth 212b on the corresponding second zipper track. Further, each zipper track comprises electrically conductive traces 214 that are coupled to the electrically conductive teeth 212a. The traces 214 extend from the teeth 212a along the tape 202 and/or the substrate 216 until they reach and electrically couple to the electronic components 218. Thus, the traces 214 provide an electric coupling between the conductive teeth 212a and one or more of the electronic components 218 on the substrate 216. As a result, when the teeth 212 are physically coupled together by the slider 208 as described above, the conductive teeth 212a on the first zipper track are electrically coupled to the corresponding conductive teeth 212a on the second zipper track thereby electrically coupling the two or more of the circuits 102 (and/or components 218) together via the traces 214 through the interlock 104. In some embodiments, the traces 214 are able to be positioned on a surface of the tape 202 and/or substrate 216. Alternatively, one or more portions or all of each of the traces 214 are able to be partially or fully embedded within the tape 202 and/or substrate 216 as they couple the teeth 212a and the components 218. In some embodiments, one or more of the traces 214 are able to electrically couple to a plurality of teeth 212a and/or a plurality of components 218. Alternatively or in addition, a plurality of the traces 214 are able to electrically couple to one tooth 212a and/or one of the components 218.

The non-conductive teeth 212b of each track are able to be positioned such that they are adjacent to and/or straddle one or more of the conductive teeth 212a in order to prevent unwanted electrical coupling between the conductive teeth 212a. In particular, if all the teeth 212 of the interlock 104 were conductive, when zipped all of the teeth 212 of the interlock 104 would be electrically coupled to each other in an alternating series between the left and right zipper tracks. As a result, the non-conductive teeth 212b are able to be used to electrically insulate one or more portions of this alternating series from the remaining portions of the alternating series. In some embodiments, a single pair of conductive teeth 212a are able to have a non-conductive tooth 212b on one or both adjacent sides. Alternatively, single pairs or greater numbers of consecutive conductive teeth 212a are able to have a non-conductive tooth 212b on one or both adjacent sides as a group. The smaller the number of conductive teeth 212a grouped together means that a greater number of electrical connections are able to fit on the interconnect 104. On the other hand, if a larger number of conductive teeth 212a are grouped together redundancy of that electrical connection is able to be produced such that if a portion of the electrical connection between one pair of the group fails the connections made by the remaining pairs are able to complete the connection such that the electrical connection is still completed.

As shown in FIG. 2, each non-conductive tooth 212b on the left track has a corresponding non-conductive tooth 212b and the right track. In this way a "double non-conductive tooth" buffer is produced between each desired group or individual conductive tooth pair when the interconnect 104 is zipped. Alternatively, only a single non-conductive tooth 212b (on either the right or left track) is able to be used to form a "single non-conductive tooth" buffer. As a result, different single and/or double buffer combinations are able to be used for each individual or set of conductive teeth 212a such as: two double buffers, two single buffers both on the same track, two single buffers on different tracks, and/or one double buffer with one single buffer.

Alternatively, in some embodiments the non-conductive teeth 212b are able to be omitted or supplemented by providing non-conducive material on the conductive teeth 212a themselves. The non-conductive material is able to be positioned such that even consecutive conductive teeth 212a are insulated from each other by the non-conductive material. For example, the conductive portion of the teeth 212a (e.g. one or top side of the teeth) on the first track would contact the conductive portion of the corresponding teeth 212a on the second track, and the non-conductive portion of the teeth 212a (e.g. other or bottom side of the teeth) on the first track would insulate the conductive portion from the other corresponding teeth 212 that are contacted. This insulating is able to be implemented on one or both tracks and for all or only some of the teeth 212 such that directly adjacent conductive teeth on one or both tracks are not electrically coupled/shorted to one another. Such embodiments provide the benefit of enabling each tooth 212 to provide a separate electrical connection if desired.

In some embodiments, the apparatus 200 is able to further comprise one or more visual indicators in order to assist with the alignment of the interconnect 104. For example, some or all of the conductive teeth 212a and/or non-conductive teeth 212b on either zipper track are able to include one or more visual indicators such that a user is able to ensure that a proper electrical connection is formed by visually observing that the indicator align. Alternatively, the visual indicators are able to be positioned on any combination of the teeth 212, the tape 202, the substrate 216 and/or other components of the apparatus 200. In some embodiments, the visual indicators are able to indicate levels of zipping/unzipping and the corresponding functions/states that are produced by the zipping or unzipping the interconnect 104 to those levels. For example, a first indicator is able to indicate a position on the interconnect 104 where if the slider 108 is moved to that position one or more of the components 218 of one or more of the circuits 102 will turn off or perform some other function. Like the alignment indicators above, these functional visual indicators are able to be positioned on any combination of the teeth 212, the tape 202, the substrate 216 and/or other components of the apparatus 200.

In some embodiments, the apparatus 200 comprises one or more insulating guards that are positioned adjacent to, coupled to and/or configured to cover one or more of the conductive teeth 212a and/or non-conductive teeth 212b in order to prevent the teeth 212 from being touched by a user or other conductive material such that an unwanted short circuit through the touching material might occur. For example, the insulating guards are able to be portions or flaps of the substrate 216 that are able to be stretched, folded or otherwise cover the front and/or back of one or more of the conductive teeth 212a and/or non-conductive teeth 212b. The insulating guards are able to be selectively physically coupled over/on the conductive teeth 212a and/or non-conductive teeth 212b with one or more fasteners such as buttons, zippers, hook and loop fasteners, and/or other types of fasteners known in the art. In some embodiments, the insulating guards are positioned and/or configured such that when the interlock 104 is zipped the insulating guards automatically cover the zipped portions of the conductive teeth 212a and/or non-conductive teeth 212b. In some embodiments, the insulating guards comprise a flexible insulating material such as cloth or fabric and/or the substrate 216 material. Alternatively, one or more of the insulating guards are able to comprise other types of flexible or rigid non-conductive material such as those used to form the non-conductive teeth 212b or other non-conductive materials well known in the art. Alternatively or in addition, as described herein, in some embodiments one or more portions of the conductive teeth 212a are non-conductive due to one or more non-conductive layers on a conductive base or a non-conductive base wherein only a portion is made conductive with one or more conductive layers. In particular, in such embodiments the non-conductive portion is able to be the faces of the teeth 212a that are exposed when the interconnect 104 is zipped (e.g. the front face, the back face). As a result, even if these exposed faces are touched by a user and/or other conductive material, it would not result in a short circuit because it would only result in touching of the non-conductive surfaces. Thus, the guards and/or protective layers provide the benefit of preventing unwanted short circuits between the conductive teeth 212a by guarding the teeth 212a from conductive material.

Accordingly, the apparatus 200 provides the benefit of enabling a user to selectively couple or uncouple the electronic circuits 102 and/or one or more components 218 thereof. Further, the apparatus 200 provides the benefit of enabling a user to control the operation of the electronic circuits 102 (and/or components 218) by selecting the extent to which the interlock 104 is zipped or unzipped. For example, if the interlock 104 is only zipped halfway, the teeth 212a and associated electrical connections possible on the lower half of the interconnect 104 will be made, while the connections on the upper half of the interconnect 104 will remain disconnected. As a result, the number of connections made is able to be selectively controlled by a user such that they are able to control the operation of the circuits 102. As described above, this control is able to be in the form of state switching (e.g. on, off, standby), software updating, or even forming completely different circuit functions by mixing and matching the combinations of circuits 102 and the connections there between with one or more interconnects 104. Additionally, it is contemplated that the apparatus 200 (the circuit interconnect 104 and/or circuits 102) is able to comprise one or more additional components and/or omit one or more of the above components.

Figure 3:
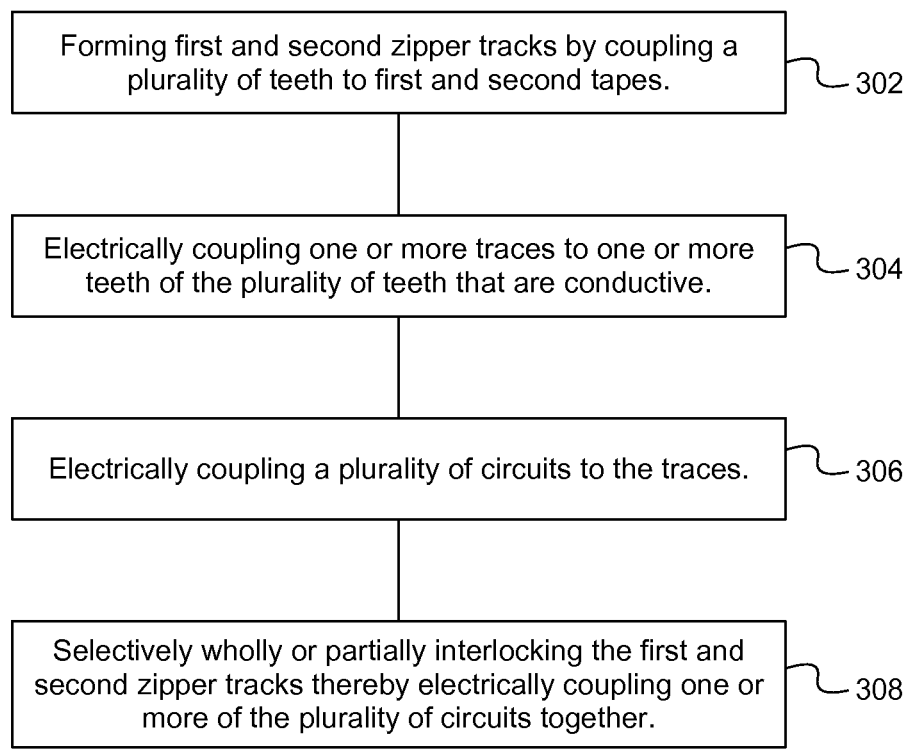
FIG. 3 illustrates a method of providing an electronic circuit interconnect apparatus according to some embodiments.

FIG. 3 illustrates a method of providing an electronic circuit interconnect apparatus according to some embodiments. At the step 302, first and second zipper tracks are formed by coupling a plurality of teeth 212 to first and second tapes. In some embodiments, the coupling of the plurality of teeth 212 comprises one or more of molding, plating, filming, one or more of the teeth 212 with conductive and/or non-conductive material. In some embodiments, the coupling of the plurality of teeth 212 comprises selectively positioning conductive and/or non-conductive teeth 212 such that pairs or larger groups of conductive teeth 212a are aligned between tapes 202 and have one or more non-conductive teeth 212b positioned adjacent thereto as single or double buffers. In some embodiments, the forming first and second zipper tracks comprises coupling one or more top stops 204 and bottom stops 206 (or a box/pin substitute) to the top and bottom of the first and second zipper tracks. At the step 304, one or more traces 214 are electrically coupled to the teeth 212a that are conductive. In some embodiments, the electrically coupling of the traces 214 comprises one or more of clamping the tooth 212a and the trace 214 together, applying current and/or pressure to weld the trace 214 to the tooth 212a followed by applying an insulation film or adhesive to cover the welding spot, and using a laser to weld the trace 214 to the tooth 212a followed by applying an insulation film or adhesive to cover the welding spot. Alternatively, other coupling methods resulting in electrical coupling between the trace 214 and the tooth 212a are able to be used. At the step 306, a plurality of circuits 102 are coupled to the traces 214. In some embodiments, the coupling is through a substrate 216 and/or the tape 202. At the step 308, the first and second zipper tracks are selectively wholly or partially interlocked thereby electrically coupling one or more of the plurality of circuits 102 together.

In some embodiments, the interlocking of the tracks comprises zipping the tracks together by sliding slider 208 along the tracks with a pull tab 210. In some embodiments, the method further comprises unzipping and removing one or more of the circuits 102 and the associated zipper tracks from another zipper track and associated circuit 102. In such embodiments, the removed circuits 102 are able to be replace with other circuits 102 that are then zipped to the remaining zipper track and associated circuit 102. In some embodiments, multiple circuits 102 and/or interconnects 104 (and the corresponding zipper tracks) are able to be coupled or decoupled together in series and/or parallel to selectively electrically couple the multiple circuits 102 and/or control their operation.

Therefore, the electronic circuit interconnect system, method and apparatus described herein provides numerous advantages. For example, it is able to provide the advantage of implementing circuitry within clothing or other materials that is able to be selectively operated based on the selective zipping of the interconnect. Further, the selective coupling provided by the interconnect enables circuitry to be selectively removed (e.g. unzipped) from an article of clothing such that the clothing is able to be washed and/or the circuitry is able to be replaced or upgraded. Moreover, it is able to provide connection redundancy and visual alignment and control cues to better facilitate the control of the apparatus and increase its robustness.

The invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications area able to be made in the embodiment chosen for illustration without departing from the spirit and scope of the invention. Specifically, it will be apparent that the interconnect 104 is able to have a structure similar to coil zippers (wherein the slider runs on two coils on each side; the teeth are formed by the windings of the coils), invisible zippers (have the teeth hidden behind a tape, so that the zipper is invisible), classic zippers (the teeth are not a coil, but are individual pieces of metal molded into shape and set on the zipper tape at regular intervals), open-ended zippers (having a box and pin mechanism to lock the two sides of the zipper into place), closed-ended zippers (closed at both ends) or other types of zippers. Further, in some embodiments, the apparatus 200 is able to comprise additional zippers that are merely used to physically couple the substrates 216 together and are separate from the interconnects 104. Consequently, the claims should be broadly construed, consistent with the spirit and scope of the invention, and should not be limited to their exact, literal meaning.

We claim:
1. An electronic circuit interconnect apparatus comprising:
   a first zipper track having a plurality of first teeth coupled to a first tape and one or more first traces electrically coupled to one or more of the first teeth that are conductive;

a second zipper track having a plurality of second teeth coupled to a second tape and one or more second traces electrically coupled to one or more of the second teeth that are conductive, wherein at least one of a remainder of the second teeth and the first teeth that are not electrically coupled to either the second traces or the first traces has a conductive base that is wholly coated with a non-conductive film;

a first circuit electrically coupled to one or more of the first traces; and a second circuit electrically coupled to one or more of the second traces, wherein the second and first zipper tracks are configured to physically zip together such that the one or more of the first teeth electrically couple with the one or more of the second teeth thereby electrically coupling the first circuit to the second circuit; and one or more visual indicators that are positioned based on and visually distinguish each group of the one or more of the first teeth and the one or more of the second teeth that are all electrically coupled together when the second and first zipper tracks are zipped together.

2. The apparatus of claim 1 wherein at least one of the one or more of the first teeth is adjacent to a non-conductive first tooth of the first teeth and at least one of the one or more of the second teeth are adjacent to a non-conductive second tooth of the second teeth.

3. The apparatus of claim 1 wherein the one or more of the first teeth and the one or more of the second teeth are positioned on the first tape and the second tape such that when the second and first zipper tracks are zipped together each of the one or more first teeth electrically couples to at least one of the one or more of the second teeth.

4. The apparatus of claim 1 wherein the one or more of the first teeth are separated into one or more groups, wherein the teeth in each group are positioned serially along the first tape such that when the second and first zipper tracks are zipped together all the teeth within one of the groups are electrically coupled together creating a redundant electrical connection.

5. The apparatus of claim 1 wherein the one or more of the first teeth and the one or more of the second teeth comprise conductive material selected from the group consisting of copper, nickel, gold, palladium, silver, a conductive polymer or a combination thereof.

6. The apparatus of claim 1 wherein the one or more of the first teeth and the one or more of the second teeth comprise a non-conductive material plated with a conductive material selected from the group consisting of copper, aluminum, nickel, gold, palladium, silver, a conductive polymer or a combination thereof.

7. The apparatus of claim 1 wherein the one or more of the first teeth and the one or more of the second teeth each have a tooth visual indicator that distinguishes the one or more of the first teeth and the one or more of the second teeth from the remainder of the plurality of first teeth and the plurality of second teeth such that the one or more of the first teeth and the one or more of the second teeth are able to be visually identified and aligned.

8. The apparatus of claim 1 further comprising:
a third zipper track having a plurality of third teeth coupled to a third tape and one or more third traces electrically coupled to one or more of the third teeth that are conductive, wherein the second circuit is electrically coupled to one or more of the third traces;
a fourth zipper track having a plurality of fourth teeth coupled to a fourth tape and one or more fourth traces electrically coupled to one or more of the fourth teeth that are conductive; and a third circuit electrically coupled to one or more of the fourth traces;
wherein the third and fourth zipper tracks are configured to physically zip together such that the one or more of the third teeth electrically couple with the one or more of the fourth teeth thereby electrically coupling the second circuit to the third circuit.

9. The apparatus of claim 1 wherein the first circuit is integrated into an article of clothing and the second circuit is integrated into the article of clothing such that the first circuit and the second circuit are physically coupled together via the article of clothing.

10. The apparatus of claim 1 wherein the first circuit is integrated into a first article of clothing and the second circuit is integrated into a second article of clothing such that the first circuit and the second circuit are only selectively physically coupled together when the first and second zipper tracks are zipped together.

11. The apparatus of claim 1 wherein the first circuit comprises a first component having a plurality of states, wherein the first component is configured to switch between the plurality of states based on which of the one or more of the first teeth are electrically coupled with the one or more of the second teeth due to the extent that the second and first zipper tracks are physically zipped together.

12. The apparatus of claim 11 wherein the second circuit comprises a battery and the plurality of states comprise a powered state and an unpowered state, wherein if all of the one or more of the first teeth are electrically coupled with the one or more of the second teeth the first component receives power from the battery and switches to the powered state and otherwise is in the unpowered state.

13. A method of providing an electronic circuit interconnect apparatus, the method comprising:
forming a first zipper track by coupling a plurality of first teeth to a first tape and electrically coupling one or more first traces to one or more of the first teeth that are conductive;
forming a second zipper track by coupling a plurality of second teeth to a second tape and electrically coupling one or more second traces to one or more of the second teeth that are conductive, wherein at least one of a remainder of the second teeth and the first teeth that are not electrically coupled to either the second traces or the first traces has a conductive base that is wholly coated with a non-conductive film;
electrically coupling a first circuit to one or more of the first traces; and
electrically coupling a second circuit to one or more of the second traces;
wherein the second and first zipper tracks are configured to physically zip together such that the one or more of the first teeth electrically couple with the one or more of the second teeth thereby electrically coupling the first circuit to the second circuit, and further wherein one or more visual indicators are positioned based on and visually distinguish each group of the one or more of the first teeth and the one or more of the second teeth that are all electrically coupled together when the second and first zipper tracks are zipped together.

14. The method of claim 13 wherein at least one of the one or more of the first teeth is adjacent to a non-conductive first tooth of the first teeth and at least one of the one or more of the second teeth are adjacent to a non-conductive second tooth of the second teeth.

15. The method of claim 13 wherein the one or more of the first teeth and the one or more of the second teeth are positioned on the first tape and the second tape such that when the second and first zipper tracks are zipped together each of the one or more first teeth electrically couples to at least one of the one or more of the second teeth.

16. The method of claim 13 wherein the one or more of the first teeth are separated into one or more groups, wherein the teeth in each group are positioned serially along the first tape such that when the second and first zipper tracks are zipped together all the teeth within one of the groups are electrically coupled together creating a redundant electrical connection.

17. The method of claim 13 wherein the one or more of the first teeth and the one or more of the second teeth comprise conductive material selected from the group consisting of copper, nickel, gold, palladium, silver, a conductive polymer or a combination thereof.

18. The method of claim 13 wherein the one or more of the first teeth and the one or more of the second teeth comprise a non-conductive material plated with a conductive material selected from the group consisting of copper, aluminum, nickel, gold, palladium, silver, a conductive polymer or a combination thereof.

19. The method of claim 13 wherein the one or more of the first teeth and the one or more of the second teeth each have a tooth visual indicator that distinguishes the one or more of the first teeth and the one or more of the second teeth from the remainder of the plurality of first teeth and the plurality of second teeth such that the one or more of the first teeth and the one or more of the second teeth are able to be visually identified and aligned.

20. The method of claim 13 further comprising:
    forming a third zipper track by coupling a plurality of third teeth to a third tape and electrically coupling one or more third traces to one or more of the third teeth that are conductive;
    electrically coupling the second circuit to one or more of the third traces;
    forming a fourth zipper track by coupling a plurality of fourth teeth to a fourth tape and electrically coupling one or more fourth traces to one or more of the fourth teeth that are conductive; and
    electrically coupling a third circuit to one or more of the fourth traces;
    wherein the third and fourth zipper tracks are configured to physically zip together such that the one or more of the third teeth electrically couple with the one or more of the fourth teeth thereby electrically coupling the second circuit to the third circuit.

21. The method of claim 13 wherein the first circuit is integrated into an article of clothing and the second circuit is integrated into the article of clothing such that the first circuit and the second circuit are physically coupled together via the article of clothing.

22. The method of claim 13 wherein the first circuit is integrated into a first article of clothing and the second circuit is integrated into a second article of clothing such that the first circuit and the second circuit are only selectively physically coupled together when the first and second zipper tracks are zipped together.

23. The method of claim 13 wherein the first circuit comprises a first component having a plurality of states, wherein the first component is configured to switch between the plurality of states based on which of the one or more of the first teeth are electrically coupled with the one or more of the second teeth due to the extent that the second and first zipper tracks are physically zipped together.

24. The method of claim 23 wherein the second circuit comprises a battery and the plurality of states comprise a powered state and an unpowered state, wherein if all of the one or more of the first teeth are electrically coupled with the one or more of the second teeth the first component receives power from the battery and switches to the powered state and otherwise is in the unpowered state.

\* \* \* \* \*